(12) United States Patent
Liu et al.

(10) Patent No.: US 10,674,600 B2
(45) Date of Patent: Jun. 2, 2020

(54) BACKLIGHT BAR, BACKLIGHT MODULE AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Dong Liu, Beijing (CN); Gang Liu, Beijing (CN); Fuan Zhu, Beijing (CN); Zhengxuan Lv, Beijing (CN); Chao Yu, Beijing (CN); Yanming Wang, Beijing (CN); Rui Liu, Beijing (CN); Zongli Gao, Beijing (CN); Jian Ren, Beijing (CN)

(73) Assignees: BOE TECHNOLOGY GROUP CO., LTD., Beijing (CN); BEIJING BOE OPTOELECTRONICS TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/074,257

(22) PCT Filed: Feb. 11, 2018

(86) PCT No.: PCT/CN2018/076289
§ 371 (c)(1),
(2) Date: Jul. 31, 2018

(87) PCT Pub. No.: WO2019/015316
PCT Pub. Date: Jan. 24, 2019

(65) Prior Publication Data
US 2019/0373715 A1    Dec. 5, 2019

(30) Foreign Application Priority Data
Jul. 19, 2017    (CN) .......................... 2017 1 0592304

(51) Int. Cl.
H05K 1/02    (2006.01)
F21V 8/00    (2006.01)
H05K 1/18    (2006.01)

(52) U.S. Cl.
CPC ........... H05K 1/0259 (2013.01); G02B 6/009 (2013.01); G02B 6/0068 (2013.01);
(Continued)

(58) Field of Classification Search
CPC ................. H05K 1/0259; H05K 1/189; H05K 2201/098; H05K 2201/10136;
(Continued)

(56) References Cited

U.S. PATENT DOCUMENTS 7,135,644 B1 * 11/2006 Gilliland .............. H05K 9/0067
174/383
2009/0108270 A1 * 4/2009 Chen ................... H01L 27/0248
257/88
(Continued)

FOREIGN PATENT DOCUMENTS

CN    101998754 A    3/2011
CN    102868012 A    9/2012
(Continued)

OTHER PUBLICATIONS

International Search Report dated Apr. 28, 2018.

*Primary Examiner* — Britt D Hanley
*Assistant Examiner* — Fatima N Farokhrooz
(74) *Attorney, Agent, or Firm* — Dilworth & Barrese, LLP.; Michael J. Musella, Esq.

(57) ABSTRACT

A backlight bar includes a flexible circuit board and backlight lamp, the flexible circuit board includes a circuit board base and an electrostatic shielding structure, the electrostatic shielding structure is disposed on a first surface of the circuit board base and located in a non-marginal region, and the
(Continued)

backlight lamp disposed on a second surface of the circuit board base, the first surface disposed opposite to the second surface. A backlight module and a display device are also provided.

17 Claims, 3 Drawing Sheets

(52) U.S. Cl.
CPC ........... *G02B 6/0083* (2013.01); *H05K 1/189* (2013.01); *H05K 2201/098* (2013.01); *H05K 2201/0969* (2013.01); *H05K 2201/09681* (2013.01); *H05K 2201/10106* (2013.01); *H05K 2201/10136* (2013.01); *H05K 2201/10522* (2013.01)

(58) Field of Classification Search
CPC .......... H05K 2201/10106; H05K 2201/09681; H05K 2201/10522; H05K 2201/0969; G02B 6/0068; G02B 6/0083; G02B 6/009
See application file for complete search history.

(56) References Cited

U.S. PATENT DOCUMENTS

| | | | |
|---|---|---|---|
| 2012/0057358 A1* | 3/2012 | Wu | H01L 25/167 362/382 |
| 2012/0147625 A1* | 6/2012 | Yang | G02B 6/0085 362/612 |
| 2013/0335355 A1* | 12/2013 | Ding | G06F 3/0416 345/173 |
| 2013/0343020 A1* | 12/2013 | He | H05K 9/0067 361/760 |
| 2015/0062466 A1* | 3/2015 | Yun | G06F 1/1601 349/12 |
| 2015/0201535 A1 | 7/2015 | Su | |
| 2016/0070130 A1* | 3/2016 | Yuminami | G02F 1/13452 349/110 |
| 2017/0016581 A1* | 1/2017 | Liaw | F21V 23/003 |
| 2018/0136524 A1* | 5/2018 | Ikegami | G02F 1/133308 |

FOREIGN PATENT DOCUMENTS

| | | |
|---|---|---|
| CN | 103763893 A | 4/2014 |
| CN | 105093684 A | 11/2015 |
| CN | 107272260 A | 10/2017 |
| WO | 2017047072 A1 | 3/2017 |

* cited by examiner

BACKLIGHT BAR, BACKLIGHT MODULE AND DISPLAY DEVICE

TECHNICAL FIELD

At least one embodiment of the present disclosure relates to a backlight bar, a backlight module and a display device.

BACKGROUND

With the development of display technology, liquid crystal display devices are widely used in the field of display. The liquid crystal display devices generally include a liquid crystal display panel and a backlight module. The backlight module is configured as a light source to provide light to the liquid crystal display panel, and the liquid crystal display panel modulates light emitted by the backlight module to realize image display.

The backlight modules typically include a backlight bar to provide light. In the art known to the inventors, the backlight bar includes a plurality of backlight lamps provided on a flexible circuit board. When Electro-Static Discharge (ESD) test is carried out, the backlight bar and the backlight module as a whole have poor antistatic capability and are easily broken down.

SUMMARY

At least one embodiment provides a backlight bar comprising a flexible circuit board and a backlight lamp, the flexible circuit board comprising a circuit board base and an electrostatic shielding structure, the electrostatic shielding structure disposed on a first surface of the circuit board base and located in a non-marginal region, and the backlight lamp disposed on a second surface of the circuit board base, the first surface disposed opposite to the second surface.

In one embodiment of the present disclosure, a side surface of the electrostatic shielding structure is a cambered surface, and the side surface of the electrostatic shielding structure is refereed as a surface on the electrostatic shielding structure 211 that intersects the circuit board base.

In one embodiment of the present disclosure, an orthographic projection of the electrostatic shielding structure on the circuit board base is circular.

In one embodiment of the present disclosure, a conductive layer and an insulating layer are sequentially disposed on the first surface of the circuit board base, the conductive layer is grounded, and the insulating layer is provided with a circular hole, and a portion of the conductive layer exposed from the circular hole forms the electrostatic shielding structure.

In one embodiment of the present disclosure, the conductive layer is a plate-shaped copper sheet or a mesh-shaped copper sheet.

In one embodiment of the present disclosure, the electrostatic shielding structure corresponds to the backlight lamp in one-to-one manner, and an orthographic projection of each electrostatic shielding structure on the first surface of the circuit board base and an orthographic projection of the backlight lamp on the first surface of the circuit board base coincides with each other.

In one embodiment of the present disclosure, a distance between the electrostatic shielding structure and a side surface of the circuit board base ranges from 0.8 mm to 1 mm.

In one embodiment of the present disclosure, the backlight lamp comprises an LED.

At least one embodiment of the present disclosure provides a backlight module, comprising a light-shielding tape and the backlight bar according to any one of claims 1 to 8, wherein the second surface of the circuit board base is attached to the light-shielding tape through a conductive tape.

At least one embodiment of the present disclosure provides a display device comprising: a display panel, an integrated circuit and the backlight module according to claim 9, the display panel is disposed on a side of the light emitting surface of the backlight module, the integrated circuit is disposed at a periphery of the display panel, and an orthographic projection of the backlight bar of the backlight module on the display panel is located outside of the integrated circuit, the outside of the integrated circuit refers to a side of the integrated circuit away from the display panel.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Figure 1A:
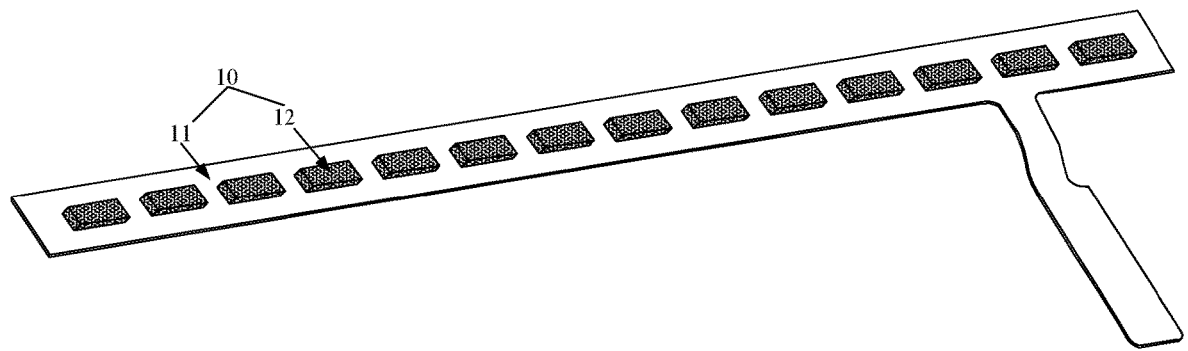
FIG. 1A is a schematic structural view of a backlight bar known to the inventors.
Figure 1B:
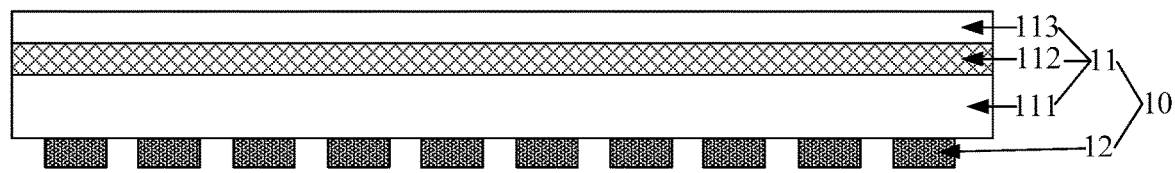
FIG. 1B is a cross-sectional view of a backlight bar known to the inventors.
Figure 1C:
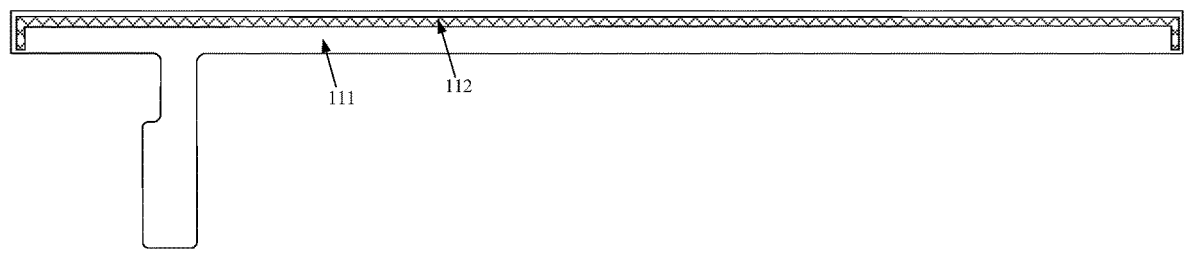
FIG. 1C is a back view of a backlight bar known to the inventors.
Figure 1D:
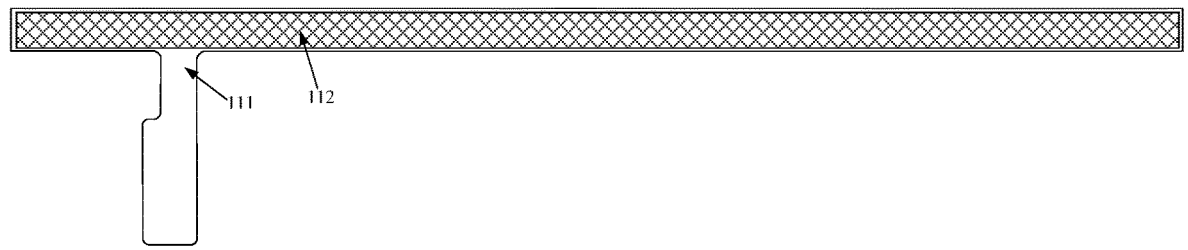
FIG. 1D is a back view of another backlight bar known to the inventors.

A backlight module typically includes a backlight bar. Please refer to FIG. 1A, which is a schematic structural view of a backlight bar 10 known to the inventors. The backlight bar 10 includes a flexible circuit board 11 and a plurality of backlight lamps 12 disposed on the flexible circuit board 11. The backlight lamps 12 can be an LED (abbreviated for light emitting diode) configured to provide light. FIG. 1B is a cross-sectional view of the backlight bar 10 as shown in FIG. 1A. Referring to FIG. 1B, the flexible circuit board 11 of the backlight bar 10 includes a circuit board base 111 and a copper sheet 112 and an insulating layer 113 which are sequentially disposed on one side of the circuit board base 111. The backlight lamps 12 and the copper sheet 112 are disposed on opposite surfaces of the circuit board base 111, and the copper sheet 112 is grounded, wherein a part or entirety of the copper sheet 112 is exposed. For example, as shown in FIG. 1C, the marginal area of the copper sheet 112 is exposed, or, as shown in FIG. 1D, the copper sheet 112 is entirely exposed.

Figure 1E:
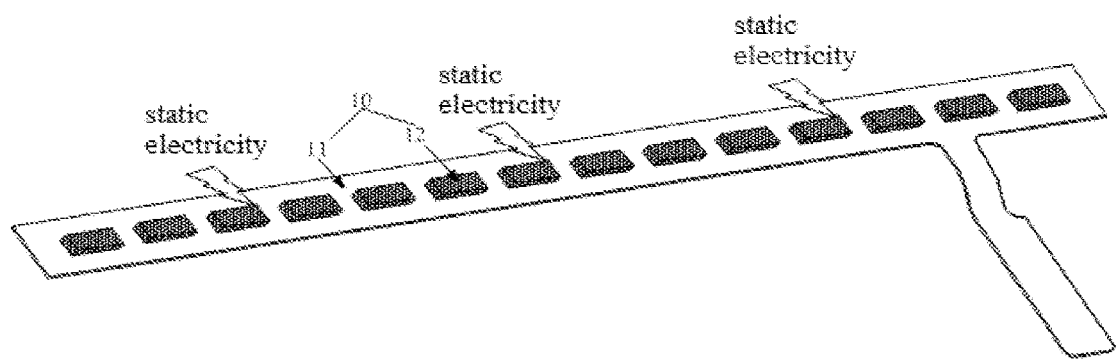
FIG. 1E is a schematic view of a backlight bar known to the inventors in which electrostatic charges reach a backlight lamp.

After the backlight module is manufactured, it is usually necessary to apply static electricity to the backlight module through an ESD gun to perform ESD test on the backlight module. During the ESD test, static electricity can be conducted to the ground through the exposed portion of the copper sheet. However, in the backlight bar 10 shown in FIGS. 1A to 1D, the exposed copper sheet 112 has an elongated structure, which makes it easy for electrostatic charges to accumulate at the margins of the exposed copper sheet 112. Moreover, since the marginal region of the copper sheet 112 or the entirety of the copper sheet 112 is exposed, all or a portion of the exposed copper sheet 112 is located at a marginal region of the circuit board base 111. Since a distance between the marginal region of the circuit board base 111 and the backlight lamp 12 is small, when there is much electrostatic charge accumulated at the marginal region of the exposed copper sheet 112, as shown in FIG. 1E, the accumulated electrostatic charge is easily discharged and break down the air between the exposed margin of the copper sheet 112 and the backlight lamp 12 and reach the backlight lamps 12, damaging the backlight lamps 12. For example, the backlight lamps 12 can be an LED, the electrostatic capacity of which is 2 KV, while the standard for applying static electricity to the backlight module for ESD test is 8 KV-10 KV, so that the static electricity applied is much greater than the electrostatic capacity of the LED. If the electrostatic charges accumulated at the margin of the exposed copper sheet 112 reach the LED, the electrostatic charges will apply a high ESD voltage to an end of the PN junction inside the LED, generating a high voltage difference between the two electrodes of the LED. The voltage difference, when the charge energy corresponding to the voltage difference is greater than the maximum charge energy that the LED can withstand (the limit value of the LED), the electrostatic charges reaching the LED lamp will be released instantaneously, and will be discharged to the LED in a very short time. The discharge will generate a local high temperature (for example, a high temperature of up to 1400 degrees Celsius) in the conductive layer and the light-emitting layer of the LED and the like, and the high temperature will make the conductive layer and the light-emitting layer of the LED melted, thereby causing malfunctions of the LED, such as darkening, turning off, being unable to be lightened on, and the like. Therefore, the LED needs to be protected during the ESD test of the backlight module.

At least one embodiment of the present disclosure provides a backlight bar that can protect the backlight lamp from being damaged by static electricity while improving the antistatic capability of the backlight bar and the antistatic capability of the backlight module by changing position and shape of the exposed copper sheet.

Figure 2A:
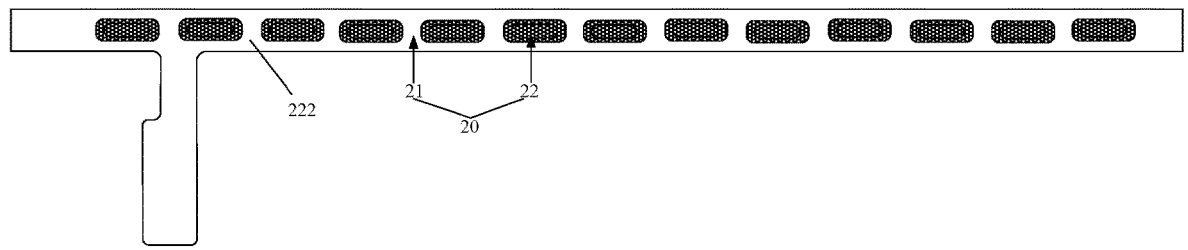
FIG. 2A is a front view of a backlight bar according to an embodiment of the present disclosure.
Figure 2B:
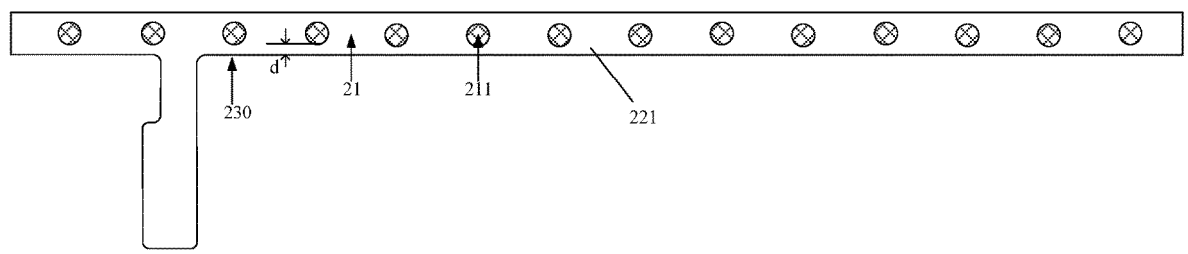
FIG. 2B is a back view of a backlight bar according to an embodiment of the present disclosure.

FIG. 2A is a front view of a backlight bar 20 according to an embodiment of the present disclosure, and FIG. 2B is a back view of a backlight bar 20 according to an embodiment of the present disclosure. Referring to FIG. 2A and FIG. 2B. The backlight bar 20 comprises a flexible circuit board 21 and a backlight lamp 22 disposed on the flexible circuit board 21, the flexible circuit board 21 comprising a circuit board base (neither illustrated in FIGS. 2A and 2B) and an electrostatic shielding structure 211. The electrostatic shielding structure 211 is disposed on the first surface 221 of the circuit board base and located in a non-marginal region, and the backlight lamp 22 is disposed on the second surface 222 of the circuit board base, the first surface 221 disposed opposite to the second surface 222.

In the backlight bar according to an embodiment of the present disclosure, since the electrostatic shielding structure is located in a non-marginal region of the first surface of the circuit board base, and the electrostatic shielding structure and the backlight lamp are respectively located on the first surfaces and the second surfaces of the circuit board base, which are disposed opposite to each other, a distance between the electrostatic shielding structure and the backlight lamp can be increased to prevent the electrostatic charges accumulated on the electrostatic shielding structure from being discharged and breaking down the air between the electrostatic shielding structure and the backlight lamp and reaching the backlight lamp, thereby contributing to improve the anti-static capacity of the backlight bar and therefore improving the antistatic capability of the backlight module as a whole.

In one embodiment of the present disclosure, a side surface of the electrostatic shielding structure 211 is a cambered surface, and the side surface of the electrostatic shielding structure 211 is refereed as a surface of the electrostatic shielding structure 211 that intersects the circuit board base. In the embodiment of the present disclosure, the side surface of the electrostatic shielding structure 211 is disposed as a cambered surface, and the formation of a tip on the electrostatic shielding structure 211 can be avoided, thereby preventing electrostatic charges from being accumulated on the electrostatic shielding structure 211, so that it is easier for the electrostatic charges to be conducted to the ground through the electrostatic shielding structure 211. The electrostatic shield structure 211 is conducted to the ground. For example, as illustrated in FIG. 2B, an orthographic projection of the electrostatic shielding structure 211 on the circuit board base is circular. In one embodiment of the present disclosure, the structure of the electrostatic shielding structure 211 can be formed to be a disk-shaped structure.

Figure 2C:
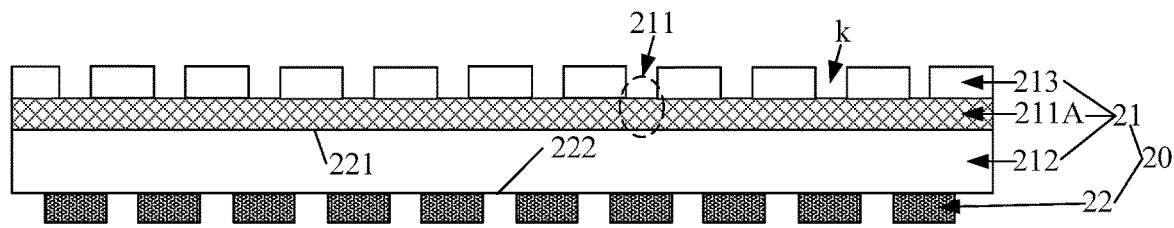
FIG. 2C is a cross-sectional view of a backlight bar according to an embodiment of the present disclosure.

Further, please refer to FIG. 2C, which illustrates a cross-sectional view of a backlight bar 20 according to an embodiment of the present disclosure, the flexible circuit board of which comprises a circuit board base 212. A first surface of the circuit board base 212. A conductive layer 211A and an insulating layer 213 are sequentially disposed on the first surface 221 of the circuit board base 212. The conductive layer 211A is grounded, and the insulating layer 213 is provided with a circular hole k. A portion of the conductive layer 211A exposed from the circular hole k forms an electrostatic shielding structure 211, and the backlight lamp 22 is disposed on the second surface 222 of the circuit board base 212, and the first surface 221 and the second surface 222 are disposed opposite to each other. In one embodiment according to the present disclosure, the conductive layer 211A can be a plate-shaped copper sheet or a mesh-shaped copper sheet. The mesh-shaped copper sheet can be a copper sheet obtained by forming a plurality of via holes on a plate-shaped copper sheet.

In one embodiment of the present disclosure, as illustrated in FIGS. 2A-2C, the electrostatic shielding structure 211 corresponds to the backlight lamp 22 in one-to-one manner, and an orthographic projection of each electrostatic shielding structure 211 on the first surface 221 of the circuit board base 212 and an orthographic projection of the backlight lamp 22 on the first surface 221 of the circuit board base 212 coincides with each other, each of the electrostatic shielding structure 211 configured to protect a corresponding backlight lamp 22.

In one embodiment of the present disclosure, as illustrated in FIG. 2B, a distance d between the electrostatic shielding structure 211 and a side surface 230 of the circuit board base ranges from 0.8 mm to 1 mm. The side face 230 intersects the first surface and the second surface of the circuit board base, respectively. In this way, the electrostatic shielding structure 211 is separated from the side surface 230 of the electrostatic shielding structure 22 at a large distance, and at the same time, there is a larger distance between the electrostatic shielding structure 211 and the backlight lamp 22. The distance between the electrostatic shielding structure 211 and the backlight lamp 22 can be regarded as a safe distance for the static electricity accumulated on the electrostatic shielding structure 211 to breakdown the air between the electrostatic shielding structure 211 and the backlight lamp 22, and the static electricity accumulated on the electrostatic shielding structure 211 cannot jump to the backlight lamp 22 and damage the backlight lamp 22. In one embodiment of the present disclosure, the backlight lamp 22 comprises an LED. The backlight lamp 22 can also be other kind of backlight lamp, and the type of the backlight lamp is not limited in the embodiments of the present disclosure.

In an embodiment of the present disclosure, a copper sheet (not illustrated in FIG. 2C) and an insulating layer (not illustrated in FIG. 2C) are further disposed on the second surface of the circuit board base, wherein the copper sheet is disposed on the second surface of the circuit board base 212, the insulating layer is disposed on the copper sheet, and the backlight lamp 22 is disposed on the insulating layer.

In the embodiment of the present disclosure, the circuit board base 212 can be made of a conductive material (for example, copper), and the insulating layer 213 can be formed of an inorganic material such as silicon oxide, silicon nitride, or aluminum oxide, and the like.

As illustrated in FIG. 2A to FIG. 2C, when fabricating a backlight bar 20, a circuit board base 212 can be first formed from a conductive material, and then a conductive layer 211A and an insulating layer 213 can be sequentially formed on the first surface of the circuit board base 212, and a circular hole k is formed in the insulating layer 213, then a copper sheet is laid on the second surface of the circuit board base 212 and an insulating layer is formed on the copper sheet, and finally the backlight lamp 22 is attached to the insulating layer on the second surface of the circuit board base 212, thus a backlight bar 20 is obtained.

It should be noted that the conductive layer 211A can be a plate-shaped copper sheet or a mesh-shaped copper sheet. When the conductive layer 211A is a plate-shaped copper sheet, the plate-shaped copper sheet can be directly laid on the first surface of the circuit board base 212. Or a conductive layer 211A is formed from copper material on the first surface of the circuit board base 212 by using a method such as magnetron sputtering, thermal evaporation or plasma enhanced chemical vapor deposition (PECVD). When the conductive layer 211A is a mesh-shaped copper sheet, a mesh-shaped copper sheet can be directly laid on the first surface of the circuit board base 212, or a copper material layer can be formed on the first surface of the circuit board base 212 through copper material by using magnetron sputtering, thermal evaporation or the like, etc. And then, a mesh is formed in the copper material layer through one patterning process so as to obtain a conductive layer 211A.

When forming the insulating layer 213, an insulating material layer such as a silicon oxide layer, a silicon nitride layer, an aluminum oxide layer, or the like can be formed on the conductive layer 211A, and then a circular hole k is formed in the insulating material layer by one patterning process on the insulating material layer so as to obtain an insulating layer 213, and a portion of the conductive layer 211A exposed from the circular hole k forms an electrostatic shielding structure 211. The one patterning process comprises coating photoresist, exposure, development, etching, and stripping photoresist. Therefore, one patterning process on the insulating material layer can comprise: forming a photoresist layer on the insulating material layer by a coating process, exposing the photoresist layer through a mask to form a completely exposed region and a non-exposed region, and then the exposed photoresist layer is processed by a developing process to perform photolithography in the completely exposed region. The photoresist in the completely exposed region is removed, while the photoresist in the non-exposed region is retained, and then an area of the insulating layer 213 corresponding to the completely exposed region is etched through an etching process so as to form a circular hole k in the area of the insulating layer 213 corresponding to the completely exposed region. And then the photoresist in the non-exposed region is stripped and an insulating layer 213 is obtained.

In the backlight bar according to an embodiment of the present disclosure, the electrostatic shielding structure is located in a non-marginal region on the first surface of the circuit board base, and the backlight lamp is located on the second surface of the circuit board base opposite to the first surface, increasing a distance between the backlight lamp and the electrostatic shielding structure and thereby preventing the electrostatic charges accumulated on the electrostatic shielding structure from breaking down the air between the electrostatic shielding structure and the backlight lamp and from reaching the backlight lamp, thus facilitating to improve the antistatic capability of the backlight bar and to improve the antistatic capability of the backlight module as a whole.

In the backlight bar according to an embodiment of the present disclosure, by changing the shape and position of the exposed copper sheet on the backlight bar, electrostatic charges are prevented from jumping from the margin of the exposed copper sheet to the backlight lamp and damaging the backlight lamp, ensuring that the backlight lamp will not be damaged by electrostatic charges. The backlight bar according to an embodiment of the present disclosure has good manufacturability and can meet requirements of mass production.

Figure 3:
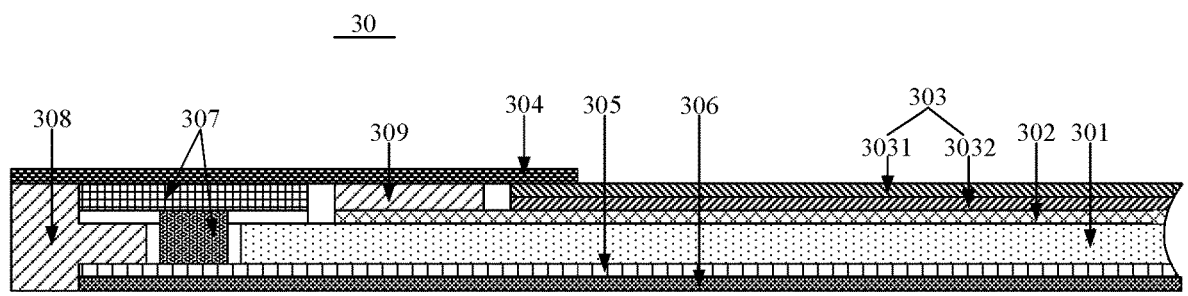
FIG. 3 is a schematic structural diagram of a backlight module according to an embodiment of the present disclosure.

At least one embodiment of the present disclosure provides a backlight module. As illustrated in FIG. 3, the backlight module 30 comprises a light guide plate 301, a diffusion sheet 302, a prism sheet 303, a light shielding tape 304, a reflective sheet 305, a protective sheet 306, a backlight bar 307 and the glue frame 308, wherein the prism sheet 303 comprises an upper prism sheet 3031 and a lower prism sheet 3032, the diffusion sheet 302, the lower prism sheet 3032 and the upper prism sheet 3031 are sequentially disposed on a light emitting surface of the light guide plate 301. The reflective sheet 305 and the protective sheet 306 are disposed on a side of the light guide plate 301 opposite to the light-emitting surface, and the glue frame 308 is disposed on the side of the light guide plate 301, and there is a gap between the glue frame 308 and the side of the light guide plate 301. The backlight bar 307 is attached to the glue frame 308 and the light guide plate 301, and the backlight lamp (not illustrated in FIG. 3) on the backlight bar 307 is located in the gap between the glue frame 308 and the side of the light guide plate 301. A margin portion of the diffusion sheet 302 adjacent to the backlight bar 307 is provided with a light absorbing tape 309. The light absorbing tape 309 can be a black tape configured to absorb a portion of light emitted by the backlight bar 307.

The backlight bar 307 can be any one of the backlight bars 20 illustrated in FIG. 2A to FIG. 2C. The light-shielding tape 304 is electrically conductive, and the light-shielding tape 304 is attached to the backlight bar 307 through a conductive tape. An orthogonal projection of the light-shielding tape 304 on the light guide plate 301 is located at the peripheral regions of the light guide plate 301, and the light-shielding tape 304 can have a shape of closed loop. The conductive tape for attaching the light-shielding tape 304 to the backlight bar 307 is in contact with the electrostatic shielding structure on the backlight bar 307. In the embodiment of the present disclosure, the structures of the light guide plate 301, the diffusion sheet 302, the prism sheet 303, the light-shielding tape 304, the reflective sheet 305, the protection sheet 306, the glue frame 308, and the light absorbing tape 309 can refer to related technologies, and the structure of the backlight bar 307 can refer to FIG. 2A to FIG. 2C, and details will not be described herein again.

During operation of the backlight module 30 as illustrated in FIG. 3, the light emitted by the backlight lamp on the backlight bar 307 is guided by the light guide plate 301, and then sequentially passes through the diffusion sheet 302, the lower prism sheet 3032, and the upper prism sheet 3031, and is emitted from the backlight module 30 at the upper prism sheet 3031. During this process, the reflective sheet 305 can reflect the light so that most of the light can be emitted from the light emitting surface of the light guide plate 301 and is incident onto the diffusion sheet 302, and finally emitted from the upper prism sheet 3031, thereby improving light extraction efficiency of the backlight module 30.

When the ESD test is performed on the backlight module 30 as illustrated in FIG. 3, electrostatic electricity is applied to the backlight module 30 from the outside of the backlight module 30 through an ESD gun, and the electrostatic electricity first reaches the light shielding tape 304, and then reach the electrostatic shielding structure of the backlight bar 307 through the conductive tape for attaching the light shielding tape 304 to the backlight bar 307, and is finally conducted to the ground through the electrostatic shielding structure of the backlight bar 307. Since the anti-static ability of the backlight bar 307 is great, the anti-static capability of the backlight module 30 as a whole is good.

In the backlight module according to the embodiment of the present disclosure, since the electrostatic shielding structure of the backlight bar is located on the non-marginal region of the circuit board base, and the electrostatic shielding structure and the backlight lamp are located on opposite surfaces of the circuit board base, the distance between the electrostatic shielding structure and the backlight lamp is increased and the electrostatic charges accumulated on the electrostatic shielding structure can be prevented from breaking down the air between the electrostatic shielding structure and the backlight lamp and from reaching the backlight lamp, thereby contributing to improving the antistatic capability of the backlight bar and thereby improving the antistatic capability of the backlight module as a whole.

Figure 4:
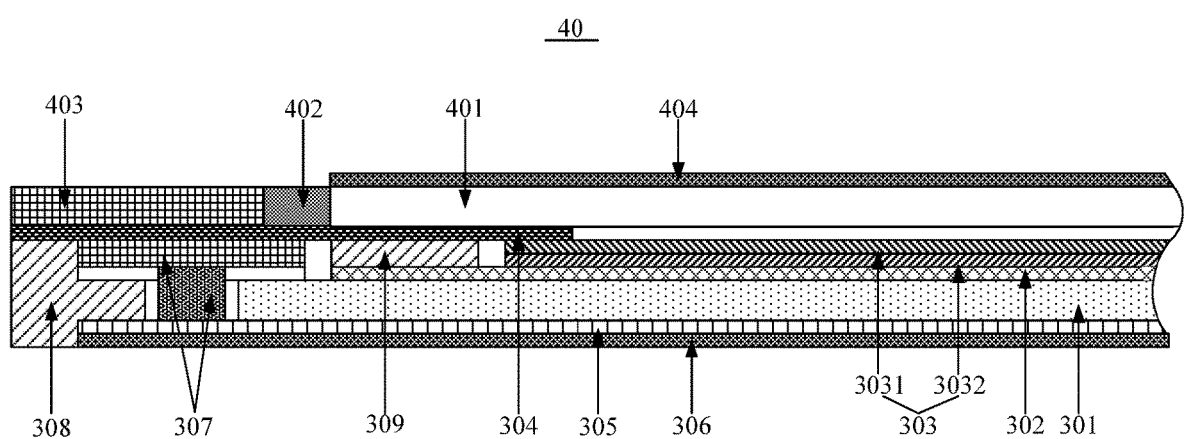
FIG. 4 is a schematic structural view of a display device according to an embodiment of the present disclosure.

At least one embodiment of the present disclosure provides a display device 40. As illustrated in FIG. 4, the display device 40 comprises a display panel 401, an integrated circuit (IC) 402, and a backlight module as illustrated in FIG. 3.

The display panel 401 is disposed on the side of the light emitting surface of the backlight module, and the integrated circuit 402 is disposed at the periphery of the display panel 401. An orthographic projection of the backlight bar 307 of the backlight module on the display panel 401 is located outside of the integrated circuit 402, wherein the outside of the integrated circuit refers to a side of the integrated circuit away from the display panel 401. A driving circuit or the like for the display panel 401 is integrated in the integrated circuit 402. In the embodiment according to the present disclosure, the orthographic projection of the backlight bar 307 of the backlight module on the display panel 401 is located outside of the integrated circuit 402, so that the electrostatic charges first contact the backlight bar 307 during the ESD test and is conducted to the ground through the electrostatic shielding structure on backlight bar 307 to prevent the electrostatic charges from reaching the integrated circuit 402, thereby protecting the integrated circuit 402.

In an embodiment according to the present disclosure, as illustrated in FIG. 4, the display device 40 further comprises: a main flexible printed circuit (FPC) 403, which can be connected with the flexible circuit board of the backlight bar 307 (not illustrated in FIG. 4), and the main flexible circuit board 403 is grounded, and the conductive layer on the flexible circuit board of the backlight bar 307 can be grounded through the main flexible circuit board 403, which is not limited in the embodiment of the present disclosure.

In one embodiment according to the present disclosure, as illustrated in FIG. 4, the display device 40 further comprises a protective film 404 attached to the light emitting surface of the display panel 401 and configured to protect the display panel 401.

It should be noted that, in an embodiment of the present disclosure, the display panel 401 can be a liquid crystal display panel, and can comprise, for example, an array substrate (not illustrated in FIG. 4), a color filter substrate (not illustrated in FIG. 4), a liquid crystal layer (not illustrated in FIG. 4) disposed between the array substrate and the color filter substrate, an upper polarizer disposed on a side of the array substrate away from the liquid crystal layer, and a lower polarizer disposed on a side of the color filter substrate away from the liquid crystal layer. The structure of the array substrate, the color filter substrate, the upper polarizer, and the lower polarizer can be referred to the related art, and details are not described herein again.

During operation of the display device 40 according to the embodiment of the present disclosure, light emitted by the backlight module is incident on the display panel 401, and is modulated by deflection of the liquid crystal layer in the display panel 401 under control of the integrated circuit 402, and is finally used to realize image display.

In the display device according to an embodiment of the present disclosure, an electrostatic shielding structure of a backlight bar is provided in a non-marginal region on a first surface of the circuit board base, and the backlight lamp is located on a second surface of the circuit board base opposite to the first surface, the distance between the backlight lamp and the electrostatic shielding structure is increased to prevent the electrostatic charges accumulated on the electrostatic shielding structure from breaking down the air between the electrostatic shielding structure and the backlight lamp and reaching the backlight lamp, which helps to improve the antistatic capability of the backlight bar and further improve the antistatic capability of the backlight module as a whole.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201710592304.5 filed on Jul. 19, 2017, the disclosure of which is hereby entirely incorporated by reference as a part of the present disclosure.

The invention claimed is:

1. A backlight bar comprising a flexible circuit board and a backlight lamp, the flexible circuit board comprising a circuit board base and an electrostatic shielding structure, the electrostatic shielding structure disposed on a first surface of the circuit board base and located in a non-marginal region, and the backlight lamp disposed on a second surface of the circuit board base, the first surface disposed opposite to the second surface, wherein a conductive layer and an insulating layer are sequentially disposed on the first surface of the circuit board base, the conductive layer is grounded, and the insulating layer is provided with a circular hole, and a portion of the conductive layer exposed from the circular hole forms the electrostatic shielding structure.

2. The backlight bar according to claim 1, wherein a side surface of the electrostatic shielding structure is a cambered surface, and the side surface of the electrostatic shielding structure is referred as a surface on the electrostatic shielding structure that intersects the circuit board base.

3. The backlight bar according to claim 1, wherein the conductive layer is a plate-shaped copper sheet or a mesh-shaped copper sheet.

4. The backlight bar according to claim 1, wherein the electrostatic shielding structure corresponds to the backlight lamp in one-to-one manner, and an orthographic projection of each electrostatic shielding structure on the first surface of the circuit board base and an orthographic projection of the backlight lamp on the first surface of the circuit board base coincides with each other.

5. The backlight bar according to claim 1, wherein a distance between the electrostatic shielding structure and a side surface of the circuit board base ranges from 0.8 mm to 1 mm.

6. The backlight bar according to claim 1, wherein the backlight lamp comprises an LED.

7. A backlight module, comprising a light-shielding tape and the backlight bar according to claim 1, wherein the second surface of the circuit board base is attached to the light-shielding tape through a conductive tape.

8. The backlight bar according to claim 2, wherein an orthographic projection of the electrostatic shielding structure on the circuit board base is circular.

9. The backlight bar according to claim 2, wherein the conductive layer is a plate-shaped copper sheet or a mesh-shaped copper sheet.

10. The backlight bar according to claim 2, wherein the electrostatic shielding structure corresponds to the backlight lamp in one-to-one manner, and an orthographic projection of each electrostatic shielding structure on the first surface of the circuit board base and an orthographic projection of the backlight lamp on the first surface of the circuit board base coincides with each other.

11. The backlight bar according to claim 2, wherein a distance between the electrostatic shielding structure and a side surface of the circuit board base ranges from 0.8 mm to 1 mm.

12. The backlight bar according to claim 2, wherein the backlight lamp comprises an LED.

13. The backlight bar according to claim 8, wherein the conductive layer is a plate-shaped copper sheet or a mesh-shaped copper sheet.

14. The backlight bar according to claim 8, wherein the electrostatic shielding structure corresponds to the backlight lamp in one-to-one manner, and an orthographic projection of each electrostatic shielding structure on the first surface of the circuit board base and an orthographic projection of the backlight lamp on the first surface of the circuit board base coincides with each other.

15. The backlight bar according to claim 8, wherein a distance between the electrostatic shielding structure and a side surface of the circuit board base ranges from 0.8 mm to 1 mm.

16. The backlight bar according to claim 8, wherein the backlight lamp comprises an LED.

17. A display device comprising: a display panel, an integrated circuit and the backlight module according to claim 7, the display panel is disposed on a side of the light emitting surface of the backlight module, the integrated circuit is disposed at a periphery of the display panel, and an orthographic projection of the backlight bar of the backlight module on the display panel is located outside of the integrated circuit, the outside of the integrated circuit refers to a side of the integrated circuit away from the display panel.

* * * * *